(12) United States Patent
Takehiro

(10) Patent No.: US 8,207,579 B2
(45) Date of Patent: Jun. 26, 2012

(54) SEMICONDUCTOR DEVICE HAVING DOUBLE DIFFUSED MOS TRANSISTORS WITH VARIED ON/OFF THRESHOLD VOLTAGES, AND METHOD OF MANUFACTURING THE SAME

(75) Inventor: Shinobu Takehiro, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 180 days.

(21) Appl. No.: 12/656,137

(22) Filed: Jan. 19, 2010

(65) Prior Publication Data

US 2010/0181616 A1 Jul. 22, 2010

(30) Foreign Application Priority Data

Jan. 19, 2009 (JP) ................... 2009-008687

(51) Int. Cl.
*H01L 27/01* (2006.01)

(52) U.S. Cl. .......... 257/336; 257/E27.098; 257/E29.055
(58) Field of Classification Search .................. 257/336, 257/499, E27.081, E27.098, E29.055
See application file for complete search history.

(56) References Cited

U.S. PATENT DOCUMENTS

2008/0093699 A1* 4/2008 Abe et al. ...................... 257/499

FOREIGN PATENT DOCUMENTS

JP 2008-124396 A 5/2008

* cited by examiner

*Primary Examiner* — Thomas L Dickey
(74) *Attorney, Agent, or Firm* — Rabin & Berdo, P.C.

(57) ABSTRACT

A semiconductor device where a plurality of DMOS transistors formed in a distributed manner on a semiconductor substrate can operate without being destroyed and a method of manufacturing the same. The on/off threshold voltage of a DMOS transistor at the innermost position from among three or more DMOS transistors formed in a distributed manner on a semiconductor is greater than the on/off threshold voltage of a DMOS transistor at the outermost position.

10 Claims, 14 Drawing Sheets

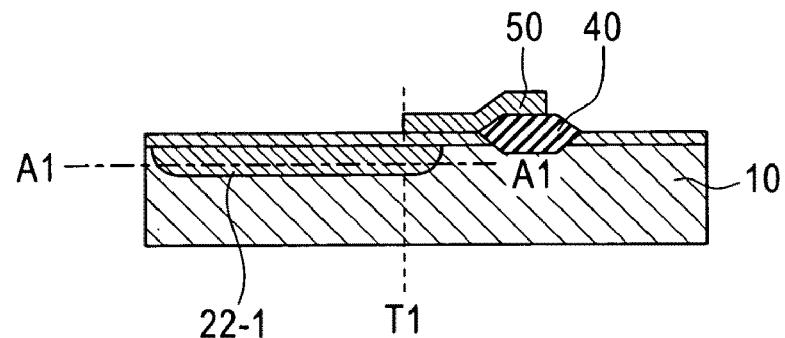
FIG. 10A
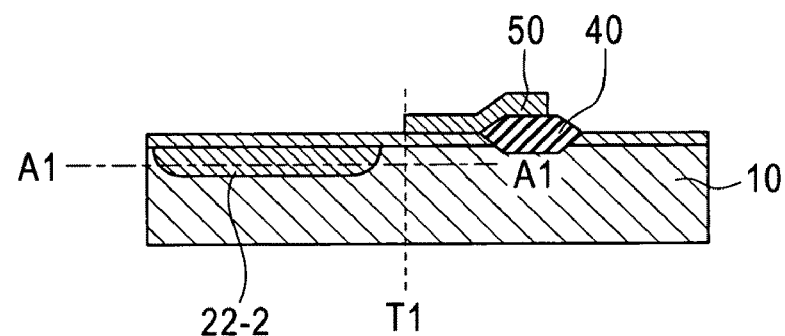
FIG. 10A
FIG. 10C
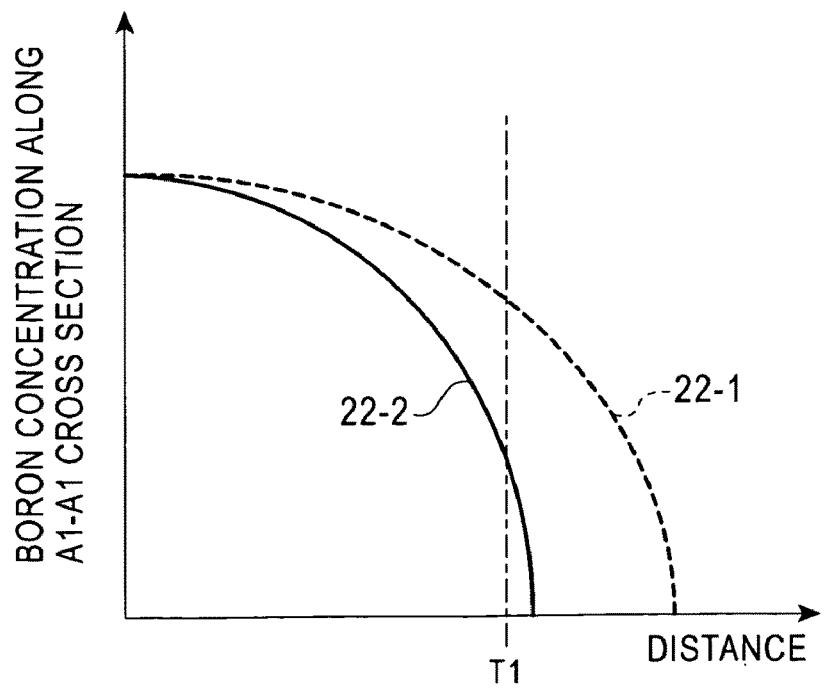

SEMICONDUCTOR DEVICE HAVING DOUBLE DIFFUSED MOS TRANSISTORS WITH VARIED ON/OFF THRESHOLD VOLTAGES, AND METHOD OF MANUFACTURING THE SAME

BACKGROUND OF THE INVENTION

1. Field of the Invention

The present invention relates to a semiconductor device including a plurality of DMOS transistors and a method of manufacturing the same.

2. Description of the Related Art

DMOS (Double Diffused MOS) transistors are known which are mainly used as switching elements in high-voltage operating devices. DMOS transistors with a body layer on the source side being of a P-type are characterized in that they have an N+ diffusion layer of a high concentration in the P-type body layer. When a voltage is applied to the gate electrode of the DMOS transistor, part of the P-type body layer near the gate electrode is inverted, and a current flows from the source electrode to the drain electrode. Where the DMOS transistors are used in a high-voltage operating device such as a DC-DC converter or the like, the device is configured to have a plurality of DMOS transistors formed in parallel as shown in, e.g., Japanese Patent Kokai No. 2008-124396 (Patent Literature 1).

SUMMARY OF THE INVENTION

However, where a device is configured to have a plurality of DMOS transistors formed in parallel, the phenomenon occurs that a DMOS transistor in the center of the device is destroyed when operating. This destruction phenomenon becomes more conspicuous as the scales of devices become larger and as the temperatures of the devices become higher. FIG. 1 is a graph indicating the drain-voltage dependency of the drain current of a DMOS transistor at device temperatures of 25° C. and 125° C. The DMOS transistor breaks down at a lower drain voltage (about 33 V) at a relatively high device temperature of 125° C. than at a device temperature of 25° C. That is, it can be seen that the withstand voltage of the DMOS transistor becomes lower as the device temperature becomes higher. Namely, in the periphery of the device, the temperature is less likely to rise because heat is radiated both vertically and laterally, while in the center the temperature is more likely to rise because lateral heat dispersion is weakened by heat generation of adjacent DMOS transistors, and hence a DMOS transistor in the center is likely to be destroyed.

The present invention has been made in view of the above problem, and an object thereof is to provide a semiconductor device where a plurality of DMOS transistors formed in parallel can operate without being destroyed and a method of manufacturing the same.

According to the present invention, there is provided a semiconductor device which includes three or more DMOS transistors formed in a distributed manner on a semiconductor substrate. The on/off threshold voltage of a DMOS transistor at the innermost position from among the DMOS transistors is greater than the on/off threshold voltage of a DMOS transistor at the outermost position.

According to the present invention, there is provided a method of manufacturing a semiconductor device which includes three or more DMOS transistors formed in a distributed manner on a semiconductor substrate. The method comprises a DMOS transistor forming step of forming the DMOS transistors such that the on/off threshold voltage of a DMOS transistor at the innermost position from among the DMOS transistors is greater than the on/off threshold voltage of a DMOS transistor at the outermost position.

According to the semiconductor device of the present invention, a plurality of DMOS transistors formed in parallel can normally operate without being destroyed. Further, the semiconductor device manufacturing method of the present invention can provide a semiconductor device where a plurality of DMOS transistors formed in parallel can operate without being destroyed.

Further, in the DMOS transistor forming step, the DMOS transistors may be formed such that the impurity concentration of a source body layer of the DMOS transistor at the innermost position is greater than the impurity concentration of a source body layer of the DMOS transistor at the outermost position.

Further, in the DMOS transistor forming step, if the number of the DMOS transistors is five or greater, the DMOS transistors may be formed such that the on/off threshold voltage decreases in the arrangement order of a DMOS transistor at the innermost position, DMOS transistors at middle positions, and a DMOS transistor at the outermost position of the DMOS transistors.

Still further, in the DMOS transistor forming step, if the number of the DMOS transistors is five or greater, the DMOS transistors may be formed such that the impurity concentration of the source body layer of each of the DMOS transistors decreases in the arrangement order of a DMOS transistor at the innermost position, DMOS transistors at middle positions, and a DMOS transistor at the outermost position of the DMOS transistors.

Still further, the DMOS transistor forming step may comprise a threshold adjusting body layer forming step of forming a threshold adjusting body layer in each of the source body layers.

Yet further, the threshold adjusting body layer forming step may comprise:

a resist forming step of forming a photosensitive resist over a surface of the semiconductor substrate;

a resist exposing-removing step of exposing the resist through a mask having three or more openings arranged in parallel with each other and removing the exposed parts of the resist; and an ion implanting step of ion implanting a dopant into portions where part of the resist is removed to form the threshold adjusting body layers.

Yet still further, the width of an opening at the innermost position from among the three or more openings may be greater than the width of an opening at the outermost position.

Yet still further, the number of the openings may be five or greater, and the widths of the openings may decrease in the arrangement order of an opening at the innermost position, openings at middle positions, and an opening at the outermost position of the openings.

Yet still further, the width at the center along a longitudinal direction of each the opening may be greater than the width at the outermost position.

Yet still further, the width of each the opening may decrease in the order of the center, a middle position, and the outermost position along a longitudinal direction of the opening.

Further, the DMOS transistor forming step may comprise:

a resist forming step of forming a resist over a surface of the semiconductor substrate except areas to become source regions and one area of each of three or more gate electrodes formed on the surface of the semiconductor substrate;

a first ion implanting step of ion implanting a first dopant into the surface of the semiconductor substrate with the resist as a mask at a predetermined acceleration voltage to form source body layers; and a second ion implanting step of ion implanting a second dopant into the surface of the semiconductor substrate with the resist as a mask at an acceleration voltage higher than the predetermined acceleration voltage to form second source body layers, wherein in the resist forming step, the resist is formed such that the one area of a gate electrode at the innermost position of the three or more gate electrodes is larger than the one area of a gate electrode at the outermost position.

Still Further, the number of the gate electrodes may be five or greater, and the resist may be formed such that the one area corresponding to each of the gate electrodes becomes smaller in the arrangement order of a gate electrode at the innermost position, gate electrodes at middle positions, and a gate electrode at the outermost position of the gate electrodes.

Further, in the DMOS transistor forming step, an LDD layer is formed in each of the source body layers.

Still further, the DMOS transistor forming step may comprise:

a resist forming step of forming a resist over a surface of the semiconductor substrate except one area extending from a position a predetermined distance away from each of three or more gate electrodes formed on the surface of the semiconductor substrate; and an ion implanting step of ion implanting a dopant with the resist as a mask to form the LDD layers, wherein in the resist forming step, the resist is formed such that the one area at a gate electrode at the innermost position of the three or more gate electrodes is larger than the one area at a gate electrode at the outermost position.

Yet further, the number of the gate electrodes may be five or greater, and the resist may be formed such that the one area corresponding to each of the gate electrodes becomes smaller in the arrangement order of a gate electrode at the innermost position, gate electrodes at middle positions, and a gate electrode at the outermost position of the gate electrodes.

Still further, the DMOS transistor forming step may further comprise a second LDD layer forming step of forming a second LDD layer in each of the source body layers.

Yet further, the second LDD layer forming step may comprise:

a gate electrode processing step of processing one area of each of three or more gate electrodes formed on a surface of the semiconductor substrate to be thinner, the one area extending over a predetermined distance from an edge of the gate electrode;

a resist forming step of forming a resist over the surface of the semiconductor substrate except a region including the one area of each the gate electrode; and an ion implanting step of ion implanting a second dopant with the resist as a mask to form the second LDD layers, wherein in the gate electrode processing step, the gate electrodes are processed such that the one area of a gate electrode at the innermost position of the three or more gate electrodes is larger than the one area of a gate electrode at the outermost position.

Yet still further, the number of the gate electrodes may be five or greater, and the gate electrodes may be processed such that the one area corresponding to each of the gate electrodes becomes smaller in the arrangement order of a gate electrode at the innermost position, gate electrodes at middle positions, and a gate electrode at the outermost position of the gate electrodes.

BRIEF DESCRIPTION OF THE DRAWINGS

FIG. 10A is a cross-sectional view of a threshold adjusting P-type layer in the source region at the center and its neighborhood;

FIG. 10B is a cross-sectional view of a threshold adjusting P-type layer in the source region at an end and its neighborhood;

FIG. 10C is a graph showing relationships between distance along dot-dashed line A1-A1 in FIGS. 10A, 10B and the respective boron concentrations of the threshold adjusting P-type layers;

DETAILED DESCRIPTION OF THE INVENTION

Embodiments of the present invention will be described in detail below with reference to the accompanying drawings.

First Embodiment

Figure 1:
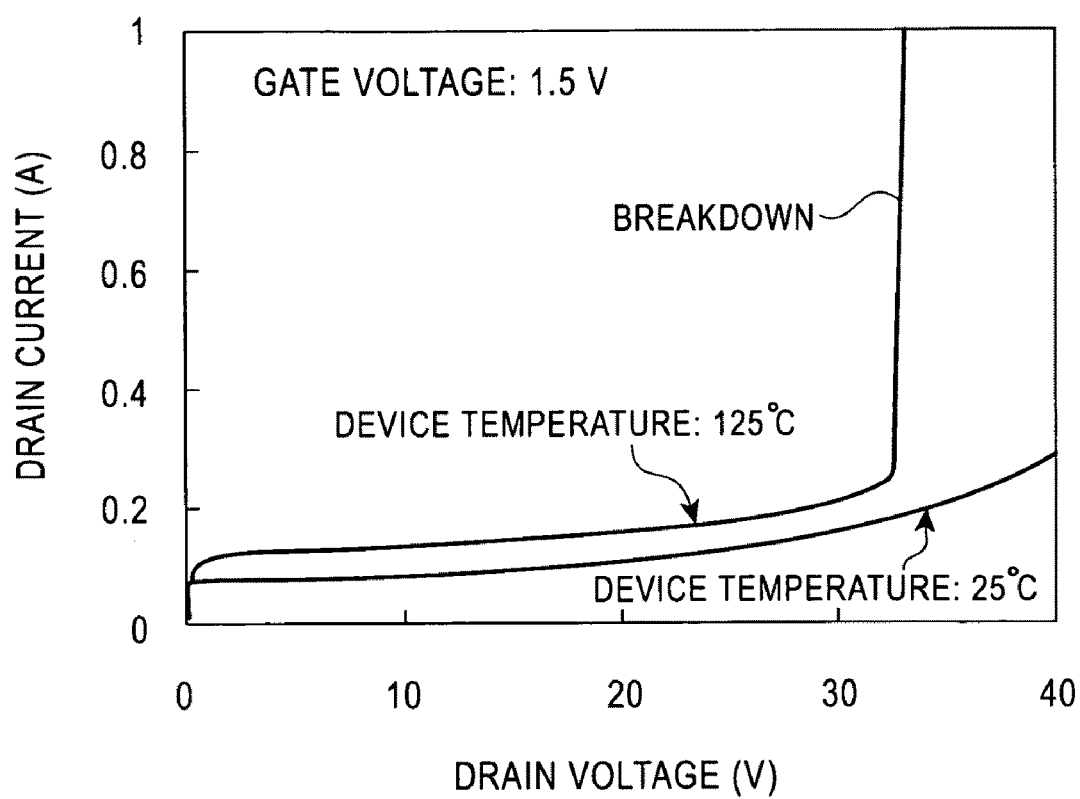
FIG. 1 is a graph indicating the drain-voltage dependency of the drain current of a DMOS transistor.
Figure 2A:
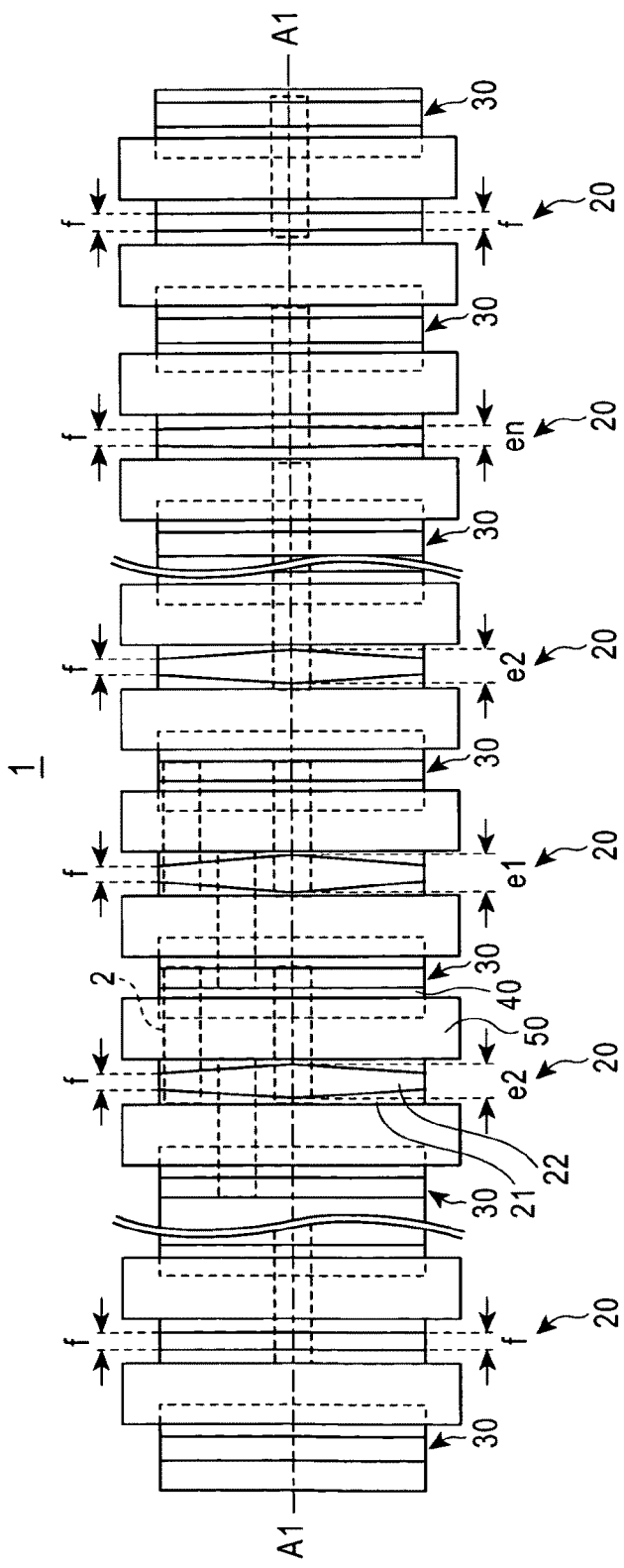
FIG. 2A is a top view of a semiconductor device according to a first embodiment.
Figure 2B:
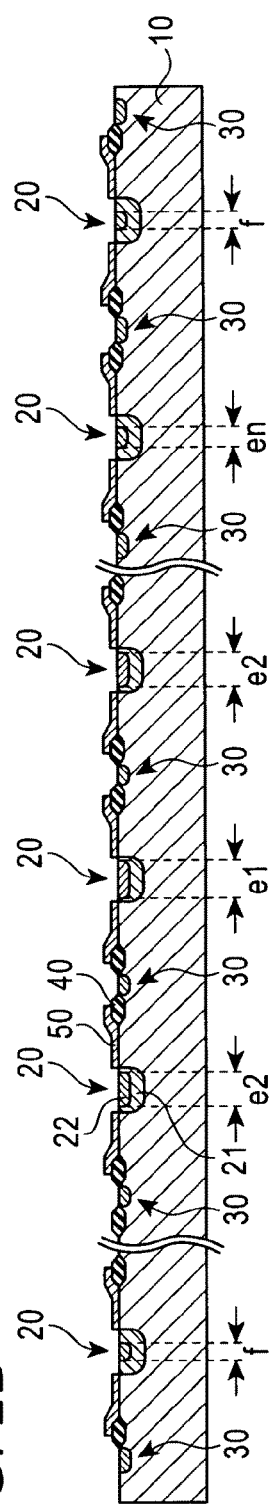
FIG. 2B is a cross-sectional view of the semiconductor device taken along dot-dashed line A1-A1 in FIG. 2A.

FIG. 2A is a top view of a semiconductor device 1 according to the present embodiment. FIG. 2B is a cross-sectional view of the semiconductor device 1 taken along dot-dashed line A1-A1 in FIG. 2A. Note that in FIGS. 2A and 2B, oxide films, electrodes, sidewalls, diffusion layers, and LDD (lightly Doped Drain) layers are not shown for convenience of description. The configuration of the semiconductor device 1 will be described with reference to FIGS. 2A and 2B.

The semiconductor device 1 is used as a high-voltage operating device such as a power MOSFET circuit of a DC-DC converter or the like. The semiconductor device 1 includes an N-type semiconductor substrate 10 made of semiconductor material such as a silicon single crystal or the like. In the semiconductor substrate 10, source regions 20 and drain regions 30 are alternately formed. A field oxide film 40 and a gate electrode 50 are formed between the source region 20 and the drain region 30.

The source region 20, the drain region 30, the field oxide film 40, and the gate electrode 50 are each in the shape of a longitudinally long strip. Multiple contacts and an electrode (not shown) are formed on each of the source region 20 and the drain region 30, and as indicated by, e.g., the dashed lines in the figure, with the source region 20, the drain region 30, the field oxide film 40, and the gate electrode 50 together as a unit, multiple DMOS transistors 2 are formed in a distributed manner.

The source region 20 comprises a P-type source body layer 21 with, e.g., boron as the dopant and a threshold adjusting P-type layer 22 having a larger doping amount of boron than the P-type source body layer 21. The threshold adjusting P-type layer 22 is a layer formed in the P-type source body layer 21 by ion implantation into the semiconductor substrate 10 surface to adjust the on/off threshold voltage (hereinafter simply called a threshold voltage) of the DMOS transistor 2. A plurality of source regions 20 are formed in parallel in the semiconductor substrate 10. The width in a parallel-arrangement direction of the P-type source body layer 21 is substantially the same for each source region 20. In contrast, the width in the parallel-arrangement direction of the threshold adjusting P-type layer 22 is different for each source region 20.

The width e1 at the center along a longitudinal direction of the threshold adjusting P-type layer 22 in the source region 20 at the innermost position along the parallel-arrangement direction is the broadest, and the width f at the center along the longitudinal direction of the threshold adjusting P-type layer 22 in the outermost source region 20 at the outermost position is the narrowest. The widths e2 to en (n is an integer greater than two) at the center along the longitudinal direction of the threshold adjusting P-type layers 22 in the source regions 20 formed in between them are smaller than the width e1 and larger than the width f. The widths e2, e3, . . . , en preferably decrease in that order. The relationship between the widths e1, e2, . . . , en, and f is expressed by, e.g., the following equation (1):

[Expression 1]

$$en = e1 - \{(n-1) \times (e1-f)/N\} \quad (1)$$

where N is the number of source regions 20 of the widths e1 to en.

For example, e1=2.5 μm, e2=2.3 μm, . . . , e10=0.7 μm, and f=0.5 μm. The threshold voltage of the DMOS transistor 2 becomes higher as the impurity concentration of the source region 20 becomes larger. Thus, the threshold voltage of the DMOS transistor 2 having the threshold adjusting P-type layer 22 of the width e1 as the source region 20 (the innermost DMOS transistor 2) is the highest, and the threshold voltage of the DMOS transistor 2 having the threshold adjusting P-type layer 22 of the width f as the source region 20 (the outermost DMOS transistor 2) is the lowest. The threshold voltages of the DMOS transistors 2 in between them are lower than that of the innermost DMOS transistor 2 and higher than that of the outermost DMOS transistor 2. The threshold voltage of the DMOS transistor 2 decreases in the innermost-to-outermost arrangement order (that is, in the order of the widths e2, e3, . . . , en of the threshold adjusting P-type layers 22).

The width (e1) at the innermost position, the widths (e2, . . . , en) at the middle positions, and the width (f) at the outermost position should decrease in that order, and the threshold adjusting P-type layers 22 may be formed, e.g., such that with adjacent ones of the widths e2, . . . , en at the middle positions being set to be the same, the width decreases stepwise per such adjacent ones.

The width of the threshold adjusting P-type layer 22 also differs along the longitudinal direction. For example, in the innermost DMOS transistor 2, the width e1 at the center along the longitudinal direction of the threshold adjusting P-type layer 22 is larger than the width f at the end along the longitudinal direction. That is, in any source region 20, the impurity concentration at the center along the longitudinal direction is the largest, and the impurity concentration at the end is the smallest. The width at a position in between the center and the end along the longitudinal direction preferably decreases gradually when going from the center toward either of the upper and lower edges.

The width at the center along the longitudinal direction, the widths at the middle positions, and the width at the end should decrease in that order, and the threshold adjusting P-type layer 22 may be formed, e.g., such that with the width of a section at a middle position being set to be uniform, the width decreases stepwise per such section.

With this configuration, the threshold voltage of the DMOS transistor 2 formed at the center along the longitudinal direction is the highest, and the threshold voltages of the DMOS transistors 2 decrease in the center-to-end arrangement order, and the threshold voltage of the DMOS transistor 2 formed at the end is the lowest. In the source regions 20 except the outermost one along the parallel-arrangement direction, the threshold adjusting P-type layer 22 is shaped as described above. In the outermost source region 20 along the parallel-arrangement direction, the width of the threshold adjusting P-type layer 22 is the width f, uniform along the longitudinal direction from the center to the end.

Note that in the actual semiconductor device 1, because of the diffusion of boron by heat treatment, the P-type source body layer 21 and the threshold adjusting P-type layer 22 spread under the gate electrode 50 as described later.

Figure 3:
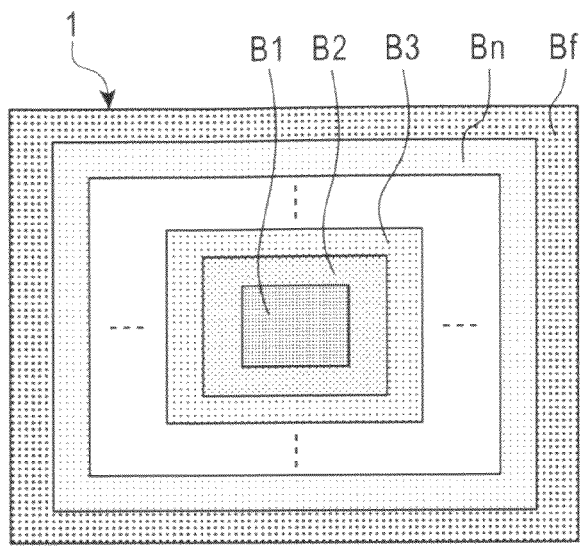
FIG. 3 shows schematically the distribution of the threshold voltages of the DMOS transistors with the configuration shown in FIGS. 2A, 2B.

FIG. 3 shows schematically the distribution of the threshold voltages of the DMOS transistors 2 with the configuration shown in FIGS. 2A, 2B. The threshold voltage of DMOS transistors 2 formed in the area B1 at the center of the semiconductor device 1 is the highest, and the threshold voltage of DMOS transistors 2 formed in the outermost area Bf is the lowest. The threshold voltage of DMOS transistors 2 formed in the area B2, B3, . . . , Bn at a middle position between them decreases in the order of the areas B2, B3, . . . , and Bn.

The threshold voltage of the DMOS transistor 2 should decrease in the order of the center area (B1), the middle areas (B2, B3, . . . , Bn), and the outermost area (Bf), and the DMOS transistors 2 may be formed, e.g., such that with the threshold voltages in adjacent ones of the areas B2, B3, . . . , Bn at the middle positions being set to be the same, the threshold voltage decreases stepwise per such adjacent areas.

Figure 4:
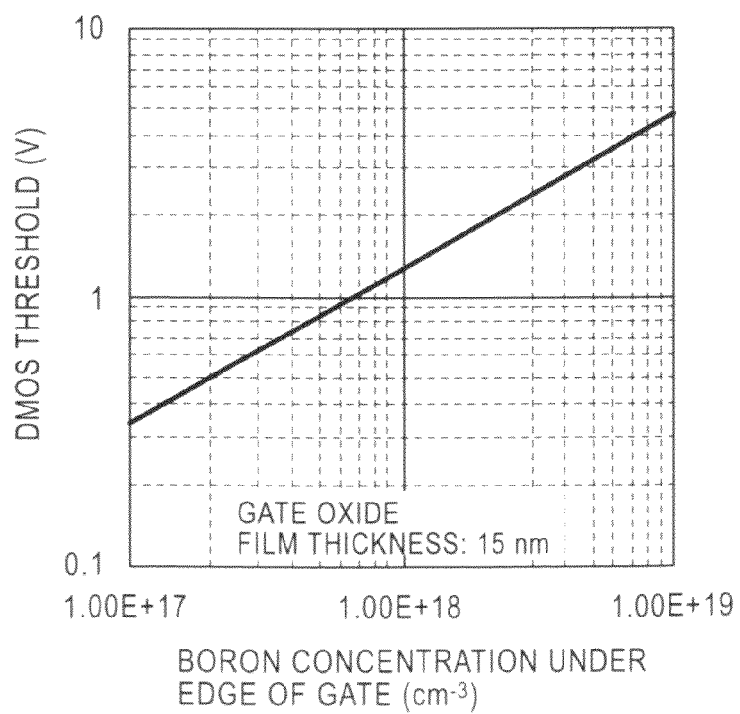
FIG. 4 is a graph showing an example of a relationship between the boron concentration directly under an edge of a gate electrode and the threshold voltage of the DMOS transistor.

FIG. 4 is a graph showing an example of a relationship between the boron concentration directly under an edge of the gate electrode 50 and the threshold voltage of the DMOS transistor 2 when the gate oxide film thickness is 15 nm. The horizontal axis represents the boron concentration (unit: $cm^{-3}$) directly under an edge of the gate electrode 50. The vertical axis represents the threshold voltage (unit: V) of the DMOS transistor 2. As shown in the graph, as the boron concentration becomes higher, the threshold voltage also becomes higher.

Figure 5:
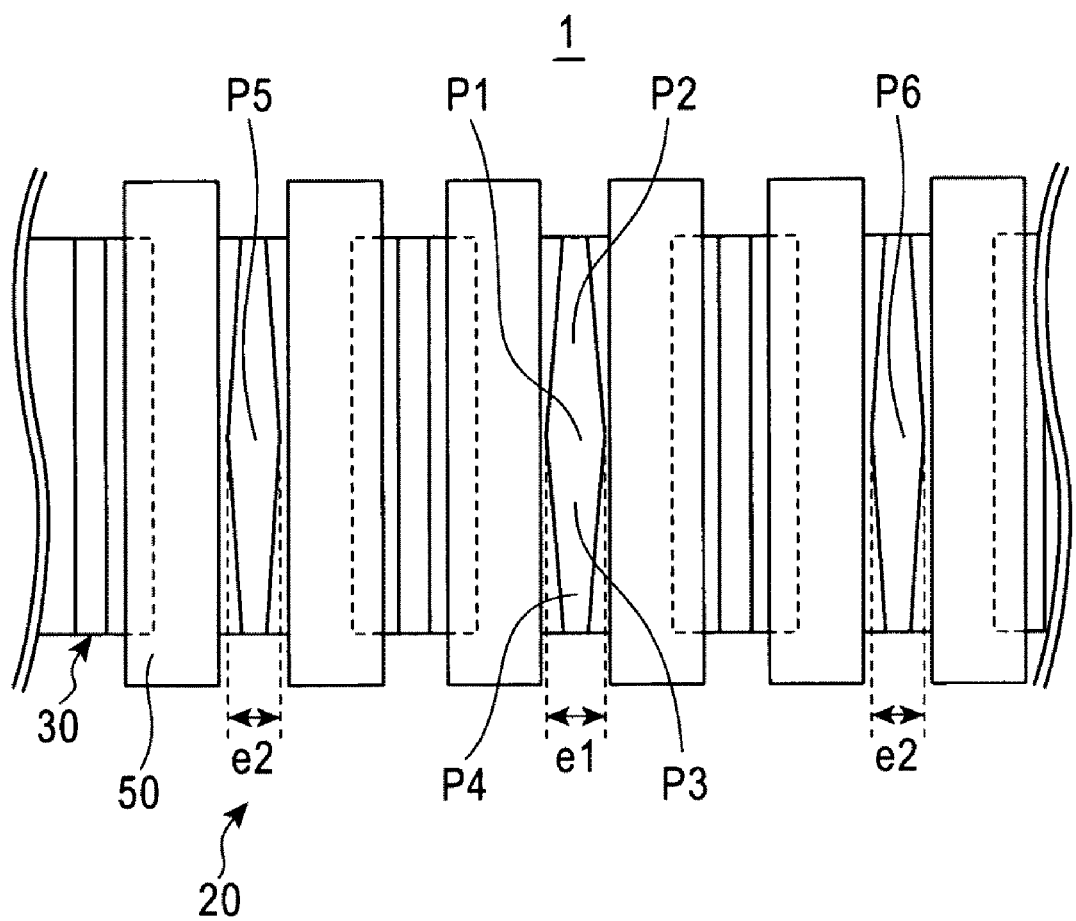
FIG. 5 is a view pointing to each point of source regions to show an example of the boron concentrations in the source regions and the threshold voltages of the DMOS transistors.

FIG. 5 is a view pointing to the points P1 to P6 of the source regions 20 to show an example of the boron concentrations in the source regions 20 and the threshold voltages of the DMOS transistors 2. In FIG. 5, the source regions 20 at the innermost position and on opposite sides thereof are shown. An example of the boron concentrations at the points P1 to P6 and the threshold voltages is as follows. At point P1, the boron concentration is $2E18$ cm$^{-3}$ and the threshold voltage is 2 V; at point P2, the boron concentration $1.3E18$ cm$^{-3}$ and the threshold voltage 1.5 V; at point P3, the boron concentration $1.3E18$ cm$^{-3}$ and the threshold voltage 1.5 V; at point P4, the boron concentration $6E17$ cm$^{-3}$ and the threshold voltage 1 V; at point P5, the boron concentration $6E17$ cm$^{-3}$ and the threshold voltage 1 V; and at point P6, the boron concentration $6E17$ cm$^{-3}$ and the threshold voltage 1 V.

As such, at the center (point P1) along the longitudinal direction of the source region 20 at the innermost position along the parallel-arrangement direction, the boron concentration and the threshold voltage are the highest. When going from the center to the end along the longitudinal direction of the source region 20 (point P1 to P2, point P1 to P3 to P4), the boron concentration and the threshold voltage decrease. Also, when going from the source region 20 at the innermost position along the parallel-arrangement direction to the source region 20 at the end (point P1 to P5, point P1 to P6), the boron concentration and the threshold voltage decrease.

Generally in the DMOS device, as the device temperature becomes higher, the threshold voltage decreases. As a result, the drain current increases, thus increasing the current that occurs due to impact ionization, which causes the phenomenon that latch-up occurs, resulting in the DMOS device being destroyed. However, according to the present embodiment, the DMOS transistors are formed such that the threshold voltage of the DMOS transistor at the center of the semiconductor device that is more likely to become high in temperature is higher than those of the DMOS transistors in the periphery. Hence, even if the threshold voltage decreases due to high temperature, the destruction of the DMOS transistor at the center can be prevented.

Second Embodiment

FIGS. 6A to 6H are cross-sectional views showing the process steps in a method of manufacturing the semiconductor device 1 according to the present embodiment. The method of manufacturing the semiconductor device 1 will be described with reference to FIGS. 6A to 6H.

Figure 6A:
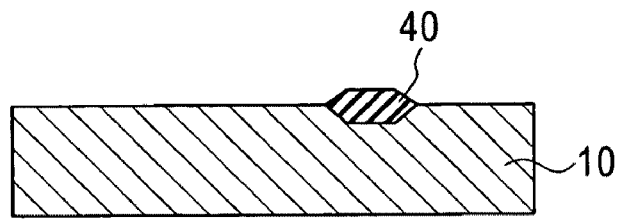
FIGS. 6A to 6H are cross-sectional views showing the process steps in a method of manufacturing a semiconductor device according to a second embodiment.

First, the field oxide film 40 of 50 to 1,000 nm thickness is formed on the surface of the N-type semiconductor substrate 10 by a film forming method usual in the semiconductor manufacturing field (FIG. 6A).

Figure 6B:
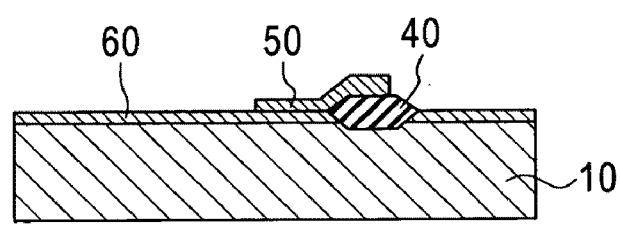

Then, a gate oxide film 60 of 1 to 100 nm thickness is formed by heat treatment in an oxygen atmosphere at a temperature of, e.g., 700 to 1,200° C. (FIG. 6B). Subsequently, impurity-doped poly-silicon of, e.g., 100 to 1,000 nm thickness is formed, and the gate electrodes 50 are formed by photolithography and etching (FIG. 6B).

Then, a resist 201 is formed over the surface of the N-type semiconductor substrate 10 by photolithography (FIG. 6C) such that the resist 201 covers entirely the drain region 30, the field oxide film 40, and the gate electrode 50, and the area extending over distance a1 from an edge T1 of the gate electrode 50 toward the source region 20. Here, the forming process of the resist 201 will be described in detail.

Figure 7A:
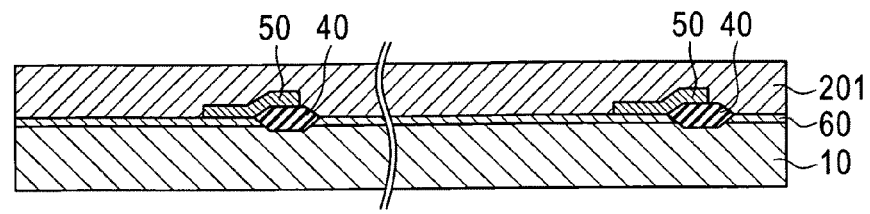
FIGS. 7A to 7C are cross-sectional views showing the steps in a resist forming process.
Figure 7B:
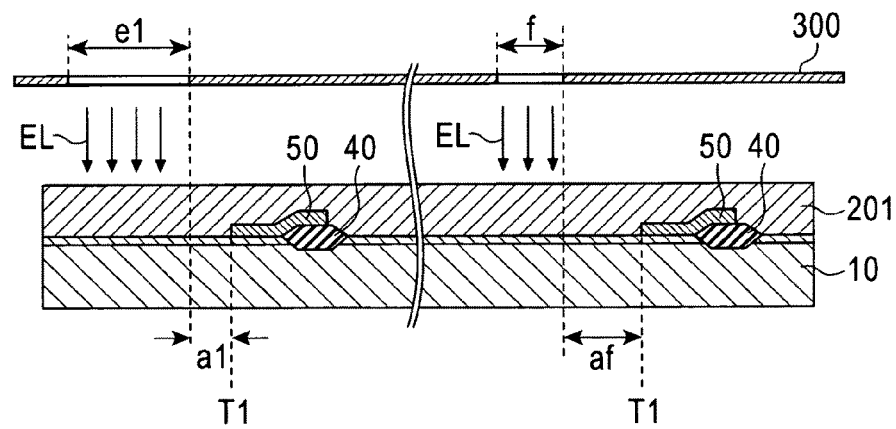
Figure 7C:
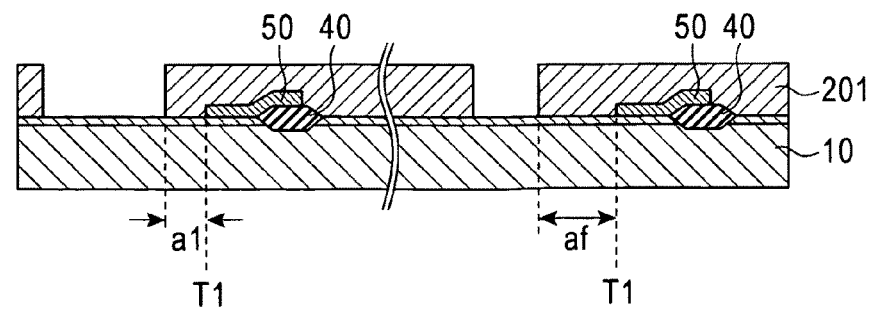

FIGS. 7A to 7C are cross-sectional views showing the steps in the forming process of the resist 201. First, the positive-type resist 201 is formed by, e.g., spin coating to cover the field oxide films 40, and the gate electrodes 50, and the gate oxide film 60 (FIG. 7A). Although only the field oxide films 40 and the gate electrodes 50 at the innermost and outermost positions are shown in FIG. 7A, in reality a plurality of middle field oxide films and middle gate electrodes (none of them shown) are formed on the gate oxide film 60, and the resist 201 is formed to cover these as well.

Figure 8:
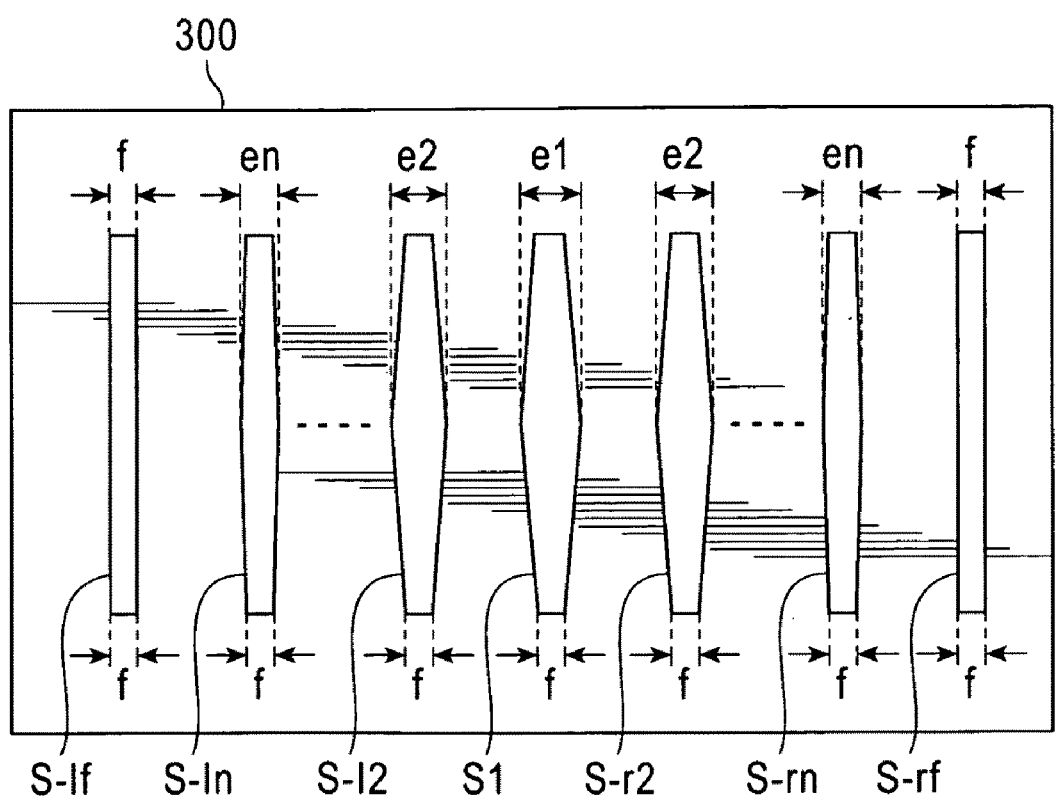
FIG. 8 is a top view of an exposure mask.

Next, the resist 201 is exposed to irradiation light EL such as ultraviolet through an exposure mask 300 as shown in FIG. 8 (FIG. 7B). An opening S1 is provided at the center of the exposure mask 300, and middle openings S-r2, S-r3, . . . , S-rn are formed in that order when going from the opening S1 toward the right end, and middle openings S-l2, . . . , S-ln are formed in parallel in that order when going from the opening S1 toward the left end. An opening S-rf is formed in the right outermost portion, and an opening S-lf is in the left outermost portion.

The width at the center along the longitudinal direction of the opening S1 at the innermost position along the parallel-arrangement direction is e1. The widths at the center along the longitudinal direction of the middle openings S-r2, S-r3, . . . , S-rn are widths e2, . . . , en respectively. Likewise, the widths at the center along the longitudinal direction of the middle openings S-l2, S-l3, S-ln are also widths e2, . . . , en respectively. The respective widths of the openings S-rf and S-lf at the outermost position along the parallel-arrangement direction are f. The widths at the end along the longitudinal direction of the openings are all the same, f. The width e1 is the largest, and the widths e2, . . . , en, and f preferably decrease in that order. The relationship between the widths e1, e2, . . . , en, and f is expressed by, e.g., the previously cited equation (1). If the size of the exposure mask 300 and the size of the semiconductor substrate 10 are on substantially the same magnification, then, for example, e1=2.5 μm, e2=2.3 μm, . . . , e10=0.7 μm, and f=0.5 μm.

The width (e1) at the innermost position, the widths (e2, . . . , en) at the middle positions, and the width (f) at the outermost position should decrease in that order, and the openings may be formed, e.g., such that with adjacent ones of the widths e2, . . . , en at the middle positions being set to be the same, the width decreases stepwise per such adjacent ones.

As shown in FIG. 7B, the width e1 of the opening S1 at the innermost position is larger than the width f of the opening S-rf at the outermost position, and the exposure field directly under the opening S1 is wider than the exposure field directly under the opening S-rf. Further, the exposure field directly under the opening S1 extends from the position distance a1 away from the edge T1 of the gate electrode 50, and the exposure field directly under the opening S-rf extends from the position distance af away from the edge T1 of the gate electrode 50. The width f of the opening S-rf is smaller than the width e1 of the opening S1, and the distance af is larger than the distance a1.

After exposure through the exposure mask 300, the resist 201 is removed (FIG. 7C). Since the exposure field directly under the opening S1 is wider than the exposure field directly under the opening S-rf, the amount of the removed part of the resist 201 is larger under the opening S1 than under the opening S-rf. Under the opening S1, part of the resist 201 that extends from the position distance a1 away from the edge T1 of the gate electrode 50 is removed. Meanwhile, under the opening S-rf, part of the resist 201 that extends from the position distance of away from the edge T1 of the gate electrode 50 is removed. That is, at the end portion, part of the resist 201 that extends from a position farther away from the edge T1 of the gate electrode 50 is removed.

Figure 6C:
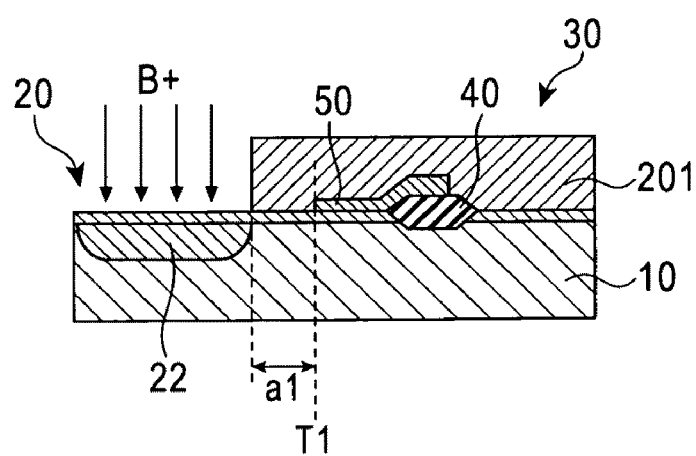

Referring back to the process steps of FIGS. 6A to 6H, subsequently with the resist 201 as a mask, an impurity dopant such as boron (B+) or the like is ion implanted into the surface of the semiconductor substrate 10 at an acceleration voltage of 10 to 500 KeV to form the threshold adjusting P-type layers 22 in the source regions 20 (FIG. 6C). Here the threshold adjusting P-type layer 22 at the innermost position along the parallel-arrangement direction of the source regions 20 and the threshold adjusting P-type layer 22 at the outermost position will be compared.

Figure 9A:
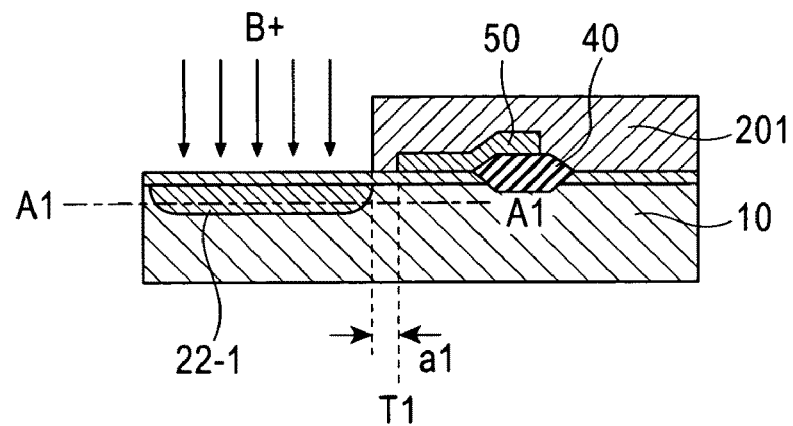
FIG. 9A is a cross-sectional view of a threshold adjusting P-type layer in the source region at the center and its neighborhood.
Figure 9B:
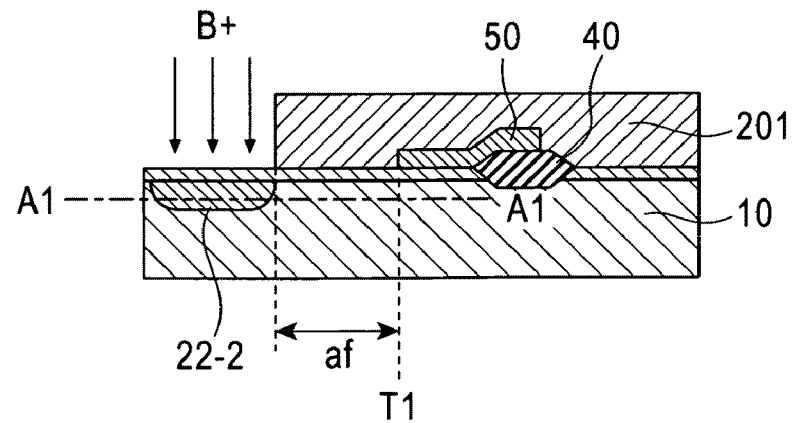
FIG. 9B is a cross-sectional view of a threshold adjusting P-type layer in the source region at an end and its neighborhood.

FIG. 9A is a cross-sectional view of a threshold adjusting P-type layer 22-1 in the source region 20 at the innermost position and its neighborhood. FIG. 9B is a cross-sectional view of a threshold adjusting P-type layer 22-2 in the source region 20 at the outermost position and its neighborhood. Because the opening of the resist 201 for the source region 20 at the innermost position is wider than the opening of the resist 201 for the source region 20 at the outermost position, the width of the threshold adjusting P-type layer 22-1 is larger than the width of the threshold adjusting P-type layer 22-2. That is, the threshold adjusting P-type layer 22-1 has a larger doping amount of boron than the threshold adjusting P-type layer 22-2.

Further, the threshold adjusting P-type layer 22-1 is formed extending from the position distance a1 away from the edge T1 of the gate electrode 50, and the threshold adjusting P-type layer 22-2 is formed extending from the position distance of away from the edge T1 of the gate electrode 50. That is, the threshold adjusting P-type layer 22-2 is formed extending from a position farther away from the edge T1 of the gate electrode 50 than the threshold adjusting P-type layer 22-1.

Referring back to the process steps of FIGS. 6A to 6H, then the resist 201 is removed, and a resist 202 is formed anew by photolithography (FIG. 6D) such that the resist 202 covers the other area than the source region 20 and part of the gate electrode 50 extending over distance b1 from the edge T1 thereof. With no restriction on the value of the distance b1, the resist 202 should be formed so as not to cover the source region 20.

Figure 6D:
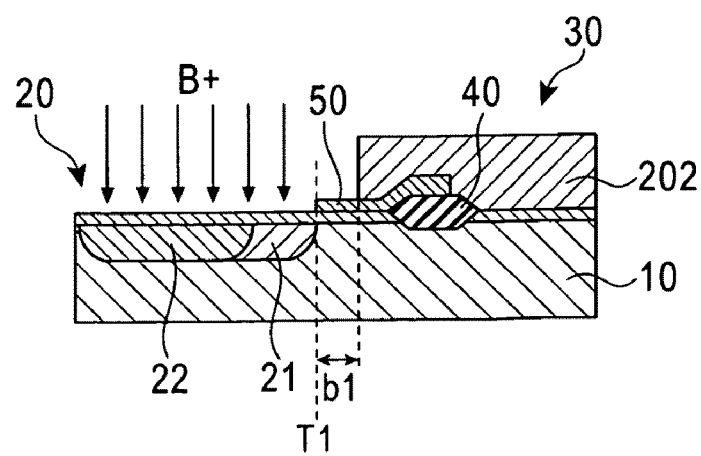

Subsequently, with the resist 202 as a mask, for example, boron (B+) is ion implanted into the areas where the threshold adjusting P-type layer 22 is already formed and the areas where the threshold adjusting P-type layer 22 is not formed of the source regions 20 in the surface of the semiconductor substrate 10 at an acceleration voltage of 10 to 500 KeV to form the P-type source body layers 21 (FIG. 6D). At this time, because the gate electrodes 50 also play the role of a mask, boron is not implanted under the gate electrodes 50. That is, the P-type source body layer 21 is not formed under the gate electrodes 50.

Figure 6E:
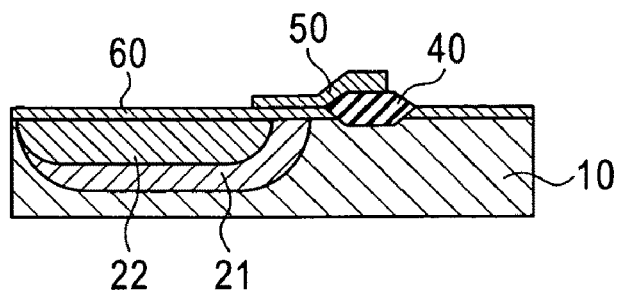

Then, boron is thermally diffused by heat treatment in, e.g., a nitrogen atmosphere at a temperature of 800 to 1,200° C. for 10 to 200 minutes to expand the threshold adjusting P-type layers 22 and the P-type source body layers 21 in the semiconductor substrate 10 (FIG. 6E). By this heat treatment, the threshold adjusting P-type layers 22 and the P-type source body layers 21 spread under the gate electrodes 50 as well. Here the threshold adjusting P-type layer 22 at the innermost position along the parallel-arrangement direction of the source regions 20 and the threshold adjusting P-type layer 22 at the outermost position will be compared.

FIG. 10A is a cross-sectional view of the threshold adjusting P-type layer 22-1 in the source region 20 at the innermost position and its neighborhood. FIG. 10B is a cross-sectional view of the threshold adjusting P-type layer 22-2 in the source region 20 at the outermost position and its neighborhood. FIG. 10C is a graph showing relationships between distance along a direction of dot-dashed line A1-A1 in FIGS. 10A, 10B and the respective boron concentrations of the threshold adjusting P-type layers 22-1 and 22-2. The horizontal axis represents the distance, and the vertical axis represents the boron concentration. The boron concentrations at and around the edge T1 of the gate electrode 50 are higher for the threshold adjusting P-type layer 22-1 than for the threshold adjusting P-type layer 22-2. That is, the impurity (boron) concentrations are higher for the source region 20 at the innermost position than for the source region 20 at the outermost position. As a result, the DMOS transistor 2 at the innermost position is higher in threshold voltage than the DMOS transistor 2 at the outermost position.

Figure 6F:
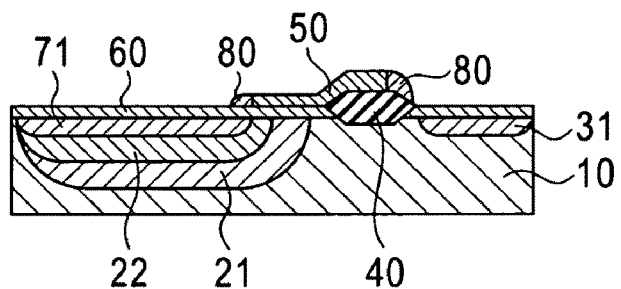

Referring back to the process steps of FIGS. 6A to 6H, then, for example, phosphorus (P+) is ion implanted into the source regions 20 and the drain regions 30 at an acceleration voltage of 10 to 200 KeV to form N-type LDD layers 71 in the source regions 20 and N-type LDD layers 31 in the drain regions 30 respectively (FIG. 6F). Subsequently, sidewalls 80 of oxide are respectively formed between the gate electrode 50 and the source region 20 and between the gate electrode 50 and the drain region 30 (FIG. 6F).

Figure 6G:
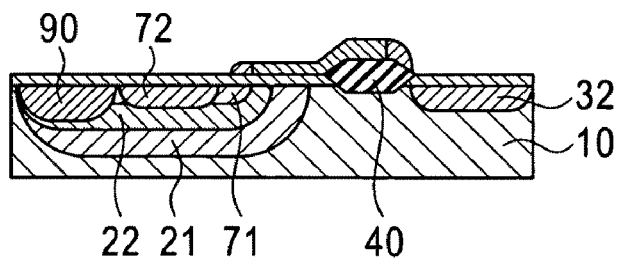

Then, for example, phosphorus (P+) is ion implanted into the source regions 20 and the drain regions 30 at an acceleration voltage of 10 to 200 KeV through photolithography and ion implantation to form N+ diffusion layers 72 in the source regions 20 and N+ diffusion layers 32 in the drain regions 30 respectively (FIG. 6G). The phosphorus concentration of the N+ diffusion layers 32 and 72 is a high concentration of, e.g., about $1 \times 10^{19}$ to $1 \times 10^{22}$ $cm^{-3}$. The N+ diffusion layer 32 functions as a drain electrode, and the N+ diffusion layer 72 functions as a source electrode. Likewise, for example, boron fluoride (BF2+) is ion implanted into the source regions 20 at an acceleration voltage of 10 to 200 KeV to form P+ diffusion layers 90 of a high boron concentration of, e.g., about $1 \times 10^{19}$ to $1 \times 10^{22}$ $cm^{-3}$ (FIG. 6G).

Figure 6H:
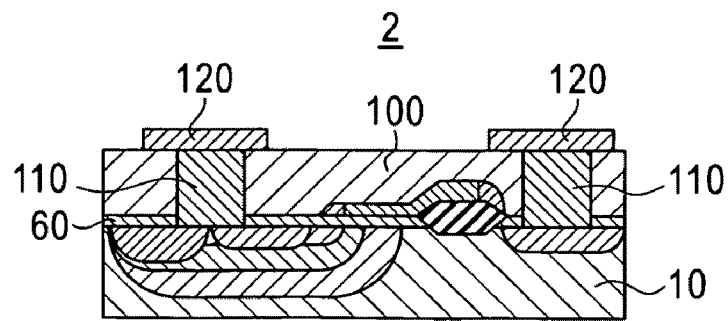

Next, an insulating film 100 such as an oxide film or the like is formed over the gate oxide film 60 by a usual film forming technique. Subsequently, a contact 110 and an electrode 120 are formed on each of the source region 20 and the drain region 30 through lithography and etching (FIG. 6H).

Undergoing the above process steps, the N-type DMOS transistors 2 having the threshold adjusting P-type layer 22 in the source region 20 are formed.

As described above, according to the method of manufacturing a semiconductor device of the present embodiment, the threshold adjusting P-type layer can be formed in each of multiple source regions formed in parallel in a semiconductor substrate. The threshold adjusting P-type layers are formed such that the impurity concentration of the source region at the center becomes higher than that of the source region at the end. As result, the threshold voltage of the DMOS transistor at the center is higher than that of the DMOS transistor at the end. With this configuration, even if the threshold voltage of the DMOS transistor at the center that is more likely to become high in temperature decreases, the destruction thereof can be prevented.

Further, because multiple DMOS transistors different in threshold voltage can be formed with only one exposure mask, the numbers of resist forming steps and of resist exposure masks can be reduced, thus reducing production costs.

Third Embodiment

Figure 11A:
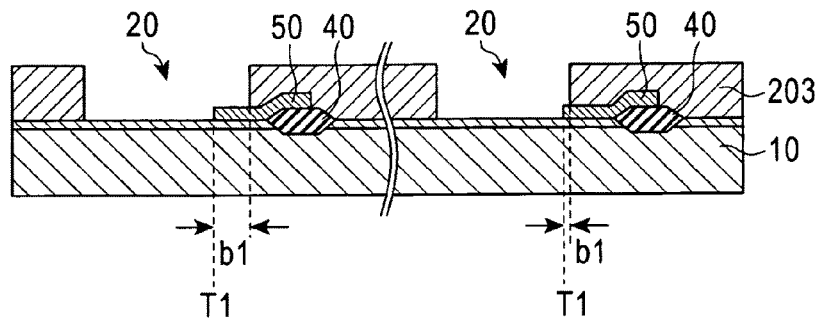
FIGS. 11A to 11C are cross-sectional views showing process steps in a method of manufacturing a semiconductor device 1 according to a third embodiment.
Figure 11B:
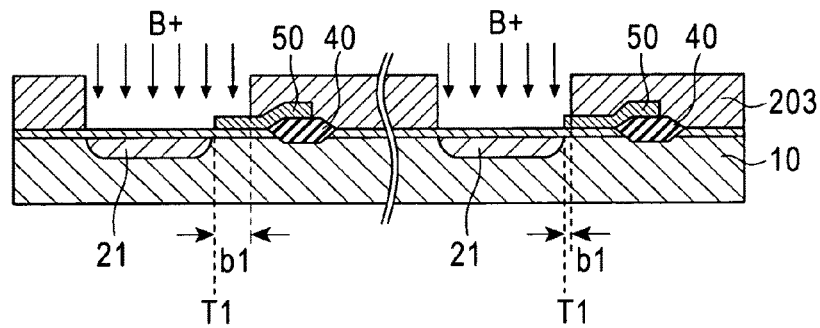
Figure 11C:
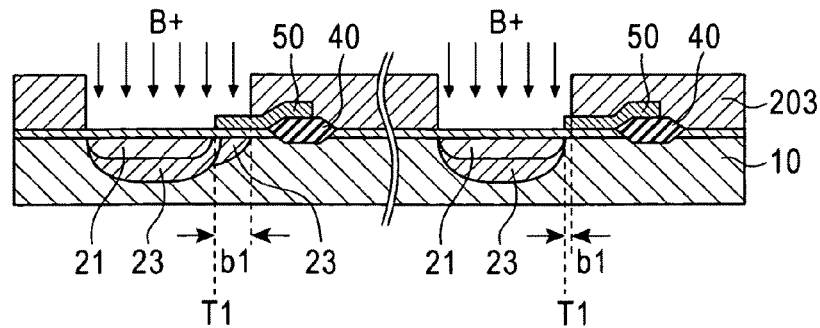

FIGS. 11A to 11C are cross-sectional views showing process steps in a method of manufacturing the semiconductor device 1 according to the present embodiment. Up to the forming steps of the field oxide film 40, the gate oxide film 60, and the gate electrode 50, the process steps are the same as in the second embodiment.

After the gate oxide film 60 is formed, a resist 203 is formed over the gate oxide film 60 by photolithography (FIG. 11A) such that the resist 203 covers the other area than the source region 20 and one area of the gate electrode 50 extending over distance b1 from the edge T1. Also, the resist 203 is formed such that the distance b1 from the edge T1 of the gate electrode 50 at the innermost position where the threshold voltage of the DMOS transistor 2 should be set relatively high is larger than the distance b1 from the edge T1 of the gate electrode 50 at the outermost position where the threshold voltage should be set relatively low.

Although only two positions, i.e., the innermost and outermost positions are shown in FIG. 11A, in reality a plurality of middle gate electrodes (not shown) are formed on the gate oxide film 60. The resist 203 is preferably formed such that the distance b1 gradually decreases when going from the middle gate electrode adjacent to the gate electrode 50 at the innermost position to the middle gate electrode adjacent to the gate electrode 50 at the outermost position. Note that the resist 203 may be formed such that with the distances b1 for adjacent ones of the middle gate electrodes being set to be the same, the distance b1 decreases stepwise per such adjacent middle gate electrodes. The distance b1 is, for example, about 0 to 1 μm.

Then, with the resist 203 as a mask, for example, boron (B+) is ion implanted into the surface of the semiconductor substrate 10 at an acceleration voltage of 10 to 500 KeV to form the P-type source body layers 21 (FIG. 11B). At this time, because parts of the gate electrodes 50 not covered by the resist 203, that is, parts of the gate electrodes 50 extending over distance b1 from the edge T1 also play the role of a mask, the P-type source body layer 21 is not formed directly under the gate electrodes 50.

Then, at a higher acceleration voltage (e.g., 600 KeV or greater) than when the P-type source body layers 21 are formed, for example, boron (B+) is ion implanted into the surface of the semiconductor substrate 10 with the resist 203 as a mask to form a second P-type source body layers 23 (FIG. 11C). By ion implanting at an increased acceleration voltage, boron passes through parts of the gate electrodes 50 not covered by the resist 203 and extending over distance b1 from the edge T1, thus forming the second P-type source body layers 23 directly under those parts as well. Meanwhile, the second P-type source body layer 23 is not formed directly under the gate electrode 50 covered by the resist 203 up to the edge T1.

Thus, the source region 20 at the innermost position is higher in boron concentration than the source region 20 at the end, and the threshold voltage of the DMOS transistor 2 at the innermost position can be made relatively high. Because the resist 203 is formed such that the distance b1 at each gate electrode 50 decreases when going from the innermost position to the outermost position, the impurity (boron) concentration of the source region 20 decreases in the arrangement order of the region at the innermost position to the region at the outermost position, and the threshold voltage of the DMOS transistor 2 also decreases in the arrangement order of the one at the innermost position to the one at the outermost position.

Subsequently, the diffusion process of the P-type source body layers 21 and the second P-type source body layers 23 may be performed as in the second embodiment, or without performing the diffusion process, the process step of forming the N-type LDD layers 71 and the subsequent process steps may be performed as in the second embodiment.

By the above process, the impurity concentration of the source region at the center is made higher than that of the source region in the periphery. As a result, the threshold voltage of the DMOS transistor at the center becomes higher than that of the DMOS transistor in the periphery. With this configuration, even if the threshold voltage of the DMOS transistor at the center that is more likely to become high in temperature decreases, the destruction thereof can be prevented.

Further, according to the present embodiment, because a resist need not be formed anew when forming the P-type source body layers and the second P-type source body layers, the numbers of resist forming steps and of resist exposure masks can be reduced, thus reducing production costs.

Fourth Embodiment

Figure 12A:
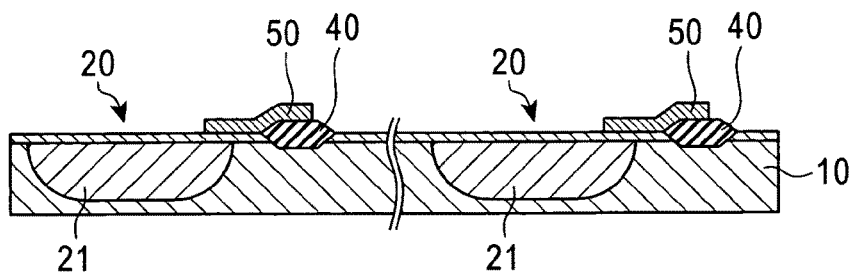
FIGS. 12A and 12B are cross-sectional views showing process steps in a method of manufacturing the semiconductor device 1 according to a fourth embodiment.
Figure 12B:
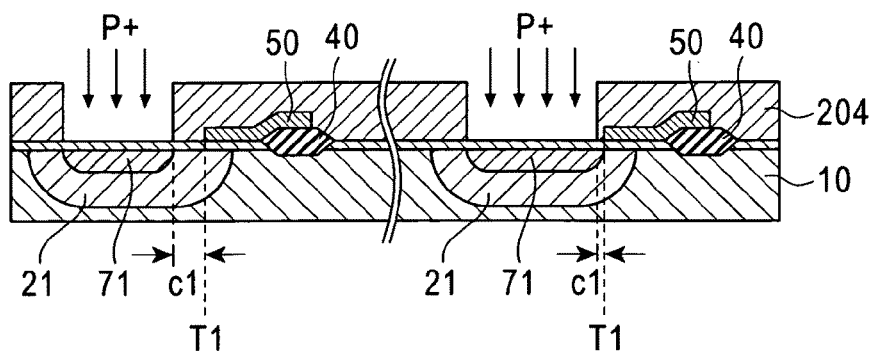

FIGS. 12A and 12B are cross-sectional views showing process steps in a method of manufacturing the semiconductor device 1 according to the present embodiment. Up to the forming steps of the field oxide film 40, the gate oxide film 60, and the gate electrode 50, the process steps are the same as in the second embodiment.

After the gate oxide film 60 is formed, with a resist (not shown) as a mask, for example, boron (B+) is ion implanted into the surface of the semiconductor substrate 10 at an acceleration voltage of 10 to 500 KeV, and subsequently boron is thermally diffused by heat treatment in, e.g., a nitrogen atmosphere at a temperature of 800 to 1,200° C. for 10 to 200 minutes to form the P-type source body layers 21 (FIG. 12A).

Then, a resist 204 is formed over the gate oxide film 60 by photolithography (FIG. 12B) such that the resist 204 covers the other area than one area extending from the position distance c1 away from the edge T1 of the gate electrode 50. Also, the resist 204 is formed such that the distance c1 from the edge T1 of the gate electrode 50 at the innermost position where the threshold voltage of the DMOS transistor 2 should be set relatively high is larger than the distance c1 from the edge T1 of the gate electrode 50 at the outermost position where the threshold voltage should be set relatively low.

Although only two positions, i.e., the innermost and outermost positions are shown in FIG. 12A, in reality a plurality of middle gate electrodes (not shown) are formed on the gate oxide film 60. The resist 204 is preferably formed such that the distance c1 gradually decreases when going from the middle gate electrode adjacent to the gate electrode 50 at the innermost position to the middle gate electrode adjacent to the gate electrode 50 at the outermost position. Note that the resist 204 may be formed such that with the distances c1 for adjacent ones of the middle gate electrodes being set to be the same, the distance c1 decreases stepwise per such adjacent middle gate electrodes. The distance c1 is, for example, about 0 to 1 μm.

Then, with the resist 204 as a mask, for example, phosphorus (P+) is ion implanted into the surface of the semiconductor substrate 10 at an acceleration voltage of 10 to 200 KeV to form N-type LDD layers 71 (FIG. 12B). At this time, because parts of the gate electrodes 50 not covered by the resist 204 also play the role of a mask, the N-type LDD layer 71 is not formed directly under the gate electrodes 50.

Because of the difference in the distance c1, the doping amount of phosphorus into the source region 20 at the innermost position is smaller than the doping amount in the source region 20 at the outermost position. The concentration of hole carriers in the P-type source body layer 21 is reduced by electron carriers from the doped phosphorus countering them. That is, the same effect can be obtained as when the source region 20 at the innermost position is made higher in boron concentration than the source region 20 at the outermost position. By this means, the threshold voltage of the DMOS transistor 2 at the innermost position can be made relatively high. Because the resist 204 is formed such that the distance c1 at each gate electrode 50 decreases in the arrangement order of the one at the innermost position to the one at the outermost position, the impurity (boron) concentration of the source region 20 decreases in the arrangement order of the region at the innermost position to the region at the outermost position, and the threshold voltage of the DMOS transistor 2 also decreases in the arrangement order of the one at the innermost position to the one at the outermost position.

Subsequently, the process step of forming the N+ diffusion layers 32, 72 and the subsequent process steps are performed as in the second embodiment.

As described above, according to the present embodiment, the threshold voltage of the DMOS transistor at the center can be made higher than that of the DMOS transistor in the periphery. With this configuration, even if the threshold voltage of the DMOS transistor at the center that is more likely to become high in temperature decreases, the destruction thereof can be prevented.

Further, according to the present embodiment, because the threshold voltage of the DMOS transistor can be adjusted by adjusting the size of the resist exposure mask for forming N-type LDD layers, a new process step need not be added. Hence production costs can be reduced.

Fifth Embodiment

Figure 13A:
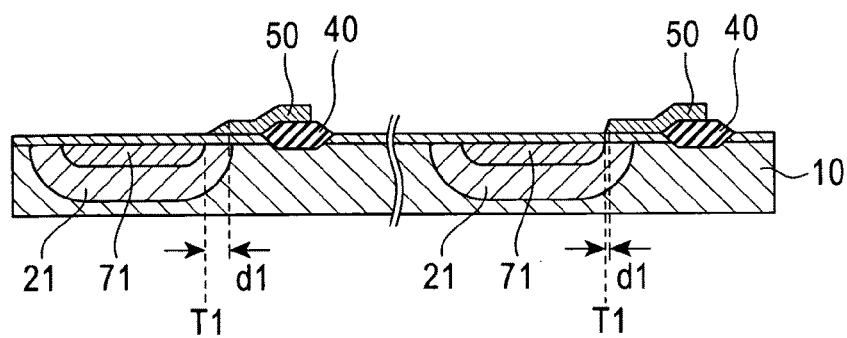
FIGS. 13A and 13B are cross-sectional views showing process steps in a method of manufacturing the semiconductor device 1 according to a fifth embodiment.
Figure 13B:
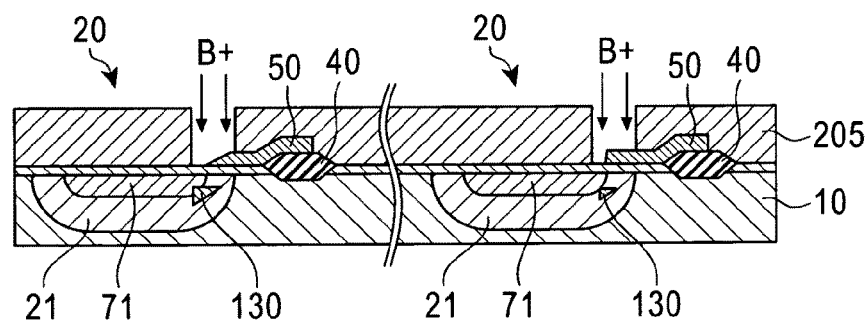

FIGS. 13A and 13B are cross-sectional views showing process steps in a method of manufacturing the semiconductor device 1 according to the present embodiment. Up to the forming step of the P-type source body layer 21, the process steps are the same as in the fourth embodiment.

After the P-type source body layers 21 are formed, a resist (not shown) is formed by photolithography, and with the resist as a mask, for example, phosphorus (P+) is ion implanted into the surface of the semiconductor substrate 10 at an acceleration voltage of 10 to 200 KeV to form N-type LDD layers 71 (FIG. 13A).

Although only two positions, i.e., the innermost and outermost positions are shown in FIG. 13A, in reality a plurality of middle source regions (not shown) are formed under the gate oxide film 60, and a resist 205 is formed so as to cover none of the middle source regions.

Although only two positions, i.e., the innermost and outermost positions are shown in FIG. 13A, in reality a plurality of middle field oxide films, middle gate electrodes, and middle P-type source body layers (none of them shown) are formed on and under the gate oxide film 60, and a middle N-type LDD layer is formed in each of the middle P-type source body layers likewise.

Then, after the resist 205 is removed, part of the gate electrode 50 extending over distance d1 from the edge is processed by etching to be in a shape such as a tapered shape (a sloping shape) so that the edge of the gate electrode 50 is made thinner (FIG. 13B). At this time, the edges of the gate electrodes 50 are processed to be thinner such that the distance d1 from the edge T1 of the gate electrode 50 at the innermost position where the threshold voltage of the DMOS transistor 2 should be set relatively high is larger than the distance d1 from the edge T1 of the gate electrode 50 at the outermost position where the threshold voltage should be set relatively low.

Although only two places, i.e., the center and an end are shown in FIG. 13B, the edges of the gate electrodes 50 are preferably processed such that the distance d1 gradually decreases when going from the middle gate electrode adjacent to the gate electrode 50 at the innermost position to the middle gate electrode adjacent to the gate electrode 50 at the outermost position. Note that they may be formed such that with the distances d1 for adjacent ones of the middle gate electrodes being set to be the same, the distance d1 decreases stepwise per such adjacent middle gate electrodes. The distance d1 is, for example, about 0 to 1 μm Then, a resist 205 is formed over the gate oxide film 60 except at and around the tapered portion of the gate electrode 50, and for example, boron (B+) is ion implanted into the semiconductor substrate 10 at an acceleration voltage of 10 to 200 KeV to form a P-type LDD layers 130 (FIG. 13B). Because the edges of the gate electrodes 50 has been processed to be in a tapered shape, boron passes through those edges, thus forming the P-type LDD layers 130 under the gate electrodes 50 as well. As such, by forming the P-type LDD layers 130 under the gate electrodes 50, the impurity (boron) concentration of the source region 20 can be increased. That is, the threshold voltage of the DMOS transistor 2 at the innermost position can be made relatively high. Because the edges of the gate electrodes 50 are processed such that the distance d1 decreases in the arrangement order of the one at the innermost position to the one at the outermost position, the impurity (boron) concentration of the source region 20 decreases in the arrangement order of the region at the innermost position to the region at the outermost position, and the threshold voltage of the DMOS transistor 2 also decreases in the arrangement order of the one at the innermost position to the one at the outermost position.

Subsequently, the process step of forming the N+ diffusion layers 32, 72 and the subsequent process steps are performed as in the second embodiment.

As described above, according to the present embodiment, the threshold voltage of the DMOS transistor at the center can be made higher than that of the DMOS transistor in the periphery. With this configuration, even if the threshold voltage of the DMOS transistor at the center that is more likely to become high in temperature decreases, the destruction thereof can be prevented.

Further, according to the present embodiment, because the edges of the gate electrodes are processed to be in a tapered shape, without performing heat treatment, the boron concentration profile at and around the gate electrode can be made to be about the same as the boron concentration profile when boron is diffused by heat treatment. Yet further, because the threshold voltages of the DMOS transistors can be adjusted in the P-type LDD layer forming step that conventionally has been performed, a new process step need not be added, and production costs can be suppressed.

Although the first embodiment is an example where the semiconductor device is in a square shape, the semiconductor device may be shaped in a polygon or a round shape.

Although the second to fifth embodiments are examples of being an N-type DMOS device, the invention can also be applied to P-type DMOS devices likewise.

Figure 14A:
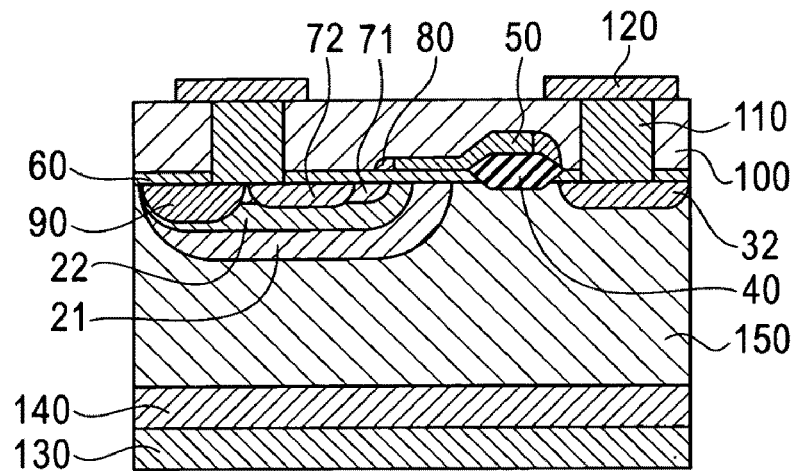
FIG. 14A is a cross-sectional view of an SOI substrate.
Figure 14B:
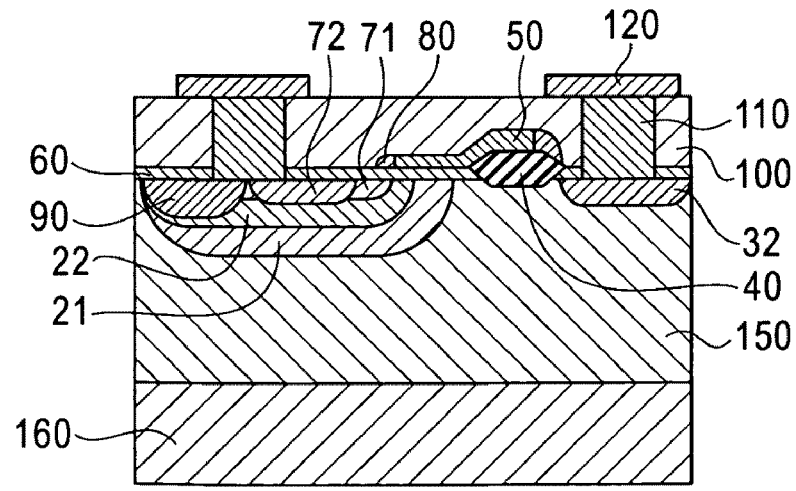
FIG. 14B is a cross-sectional view of an oxide substrate.

Although the first to fifth embodiments are examples where a bulk substrate is used, the invention can also be applied to an SOI (Silicon on Insulator) substrate comprising a P-type substrate 130, a buried oxide film 140, and an N-type SOI layer 150 as shown in FIG. 14A, and an oxide substrate 160 made mostly of oxide such as $SiO_2$, $Al_2O_3$, or the like as shown in FIG. 14B. Because generally the SOI substrate and the oxide substrate are poorer in heat conduction than a silicon substrate, it is more effective to apply the embodiments to the SOI substrate and the oxide substrate. Note that as to material for substrates, the invention can also be applied to not only Si but also compound semiconductor materials such as Ge, SiC, GaAs, and GaN.

This application is based on Japanese Patent Application No. 2009-008687 which is herein incorporated by reference.

What is claimed is:

1. A semiconductor device which includes three or more DMOS transistors formed in a distributed manner on a semiconductor substrate, wherein:
the on/off threshold voltage of a DMOS transistor at the innermost position from among said DMOS transistors is greater than the on/off threshold voltage of a DMOS transistor at the outermost position.

2. A semiconductor device according to claim 1, wherein the impurity concentration of a source body layer of the DMOS transistor at said innermost position is greater than the impurity concentration of a source body layer of the DMOS transistor at said outermost position.

3. A semiconductor device according to claim 1, wherein five or more of said DMOS transistors are provided, and said on/off threshold voltage decreases in the arrangement order of a DMOS transistor at the innermost position, DMOS transistors at middle positions, and a DMOS transistor at the outermost position of said DMOS transistors.

4. A semiconductor device according to claim 3, wherein five or more of said DMOS transistors are provided, and the impurity concentration of a source body layer of each of said DMOS transistors decreases in the arrangement order of a DMOS transistor at the innermost position, DMOS transistors at middle positions, and a DMOS transistor at the outermost position of said DMOS transistors.

5. A semiconductor device, comprising three or more DMOS transistors formed in a distributed manner on a semiconductor substrate, wherein
the on/off threshold voltage of a DMOS transistor at the innermost position from among said DMOS transistors is greater than the on/off threshold voltage of a DMOS transistor at the outermost position;
the impurity concentration of a source body layer of the DMOS transistor at said innermost position is greater than the impurity concentration of a source body layer of the DMOS transistor at said outermost position; and
a threshold adjusting body layer is formed in each of said source body layers, and the width of said threshold adjusting body layer corresponding to the DMOS transistor at said innermost position is larger than the width of said threshold adjusting body layer corresponding to the DMOS transistor at said outermost position.

6. A semiconductor device according to claim 5, wherein the width at the center along a longitudinal direction of said threshold adjusting body layer is greater than the width at the outermost position.

7. A semiconductor device according to claim 5, wherein the width of said threshold adjusting body layer decreases in the order of the center, a middle position, and the outermost position along a longitudinal direction of said threshold adjusting body layer.

8. A semiconductor device comprising five or more DMOS transistors formed in a distributed manner on a semiconductor substrate, wherein
the on/off threshold voltage of a DMOS transistor at the innermost position from among said DMOS transistors is greater than the on/off threshold voltage of a DMOS transistor at the outermost position;
said on/off threshold voltage decreases in the arrangement order of a DMOS transistor at the innermost position, DMOS transistors at middle positions, and a DMOS transistor at the outermost position of said DMOS transistors;
the impurity concentration of a source body layer of each of said DMOS transistors decreases in the arrangement order of a DMOS transistor at the innermost position, DMOS transistors at middle positions, and a DMOS transistor at the outermost position of said DMOS transistors; and
a threshold adjusting body layer is formed in each of said source body layers, and the width of said threshold adjusting body layer corresponding to each of said DMOS transistors decreases in said arrangement order of the DMOS transistor at the innermost position, the DMOS transistors at middle positions, and the DMOS transistor at the outermost position.

9. A semiconductor device according to claim 8, wherein the width at the center along a longitudinal direction of said threshold adjusting body layer is greater than the width at the outermost position.

10. A semiconductor device according to claim 8, wherein the width of said threshold adjusting body layer decreases in the order of the center, middle positions, and the outermost position along a longitudinal direction of said threshold adjusting body layer.

\* \* \* \* \*